United States Patent
Peyre-Lavigne et al.

(10) Patent No.: US 6,906,381 B2
(45) Date of Patent: Jun. 14, 2005

(54) LATERAL SEMICONDUCTOR DEVICE WITH LOW ON-RESISTANCE AND METHOD OF MAKING THE SAME

(75) Inventors: Andre Peyre-Lavigne, Ramonville St Agne (FR); Irenee Pages, Gemenos (FR); Pierre Rossel, Ramonville St Agne (FR); Frederic Morancho, Ramonville St Agne (FR); Nathalie Cezac, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 58 days.

(21) Appl. No.: 10/297,693

(22) PCT Filed: Jun. 8, 2001

(86) PCT No.: PCT/EP01/06627

§ 371 (c)(1),
(2), (4) Date: Jun. 26, 2003

(87) PCT Pub. No.: WO01/95397

PCT Pub. Date: Dec. 13, 2001

(65) Prior Publication Data

US 2004/0222461 A1 Nov. 11, 2004

(30) Foreign Application Priority Data

Jun. 9, 2000 (EP) .............................. 00401643

(51) Int. Cl.[7] .............................................. H01L 29/76
(52) U.S. Cl. ................ 257/333; 257/341; 257/343; 257/409; 257/491; 257/492; 257/493; 438/270; 438/140; 438/454
(58) Field of Search ................................ 257/327, 339, 257/347, 331, 329, 328, 348, 351, 352

(56) References Cited

U.S. PATENT DOCUMENTS 6,097,063 A * 8/2000 Fujihira ...................... 257/339

6,445,038 B1 * 9/2002 Tihanyi ....................... 257/347
6,455,911 B1 * 9/2002 Stephani et al. ............. 257/493

FOREIGN PATENT DOCUMENTS

| DE | 198 00 647 C1 | 5/1999 | |
|---|---|---|---|
| DE | 19800647 C1 | 5/1999 | |
| EP | 0 571 027 A1 | 11/1993 | |
| EP | 0571027 * | 11/1993 | ......... H01L/29/784 |
| GB | 2309336 A | 7/1997 | |
| WO | WO 00/72360 A2 | 5/2000 | |
| WO | WO 00/72360 * | 5/2000 | |
| WO | WO 00/72360 A2 A3 | 11/2000 | |

OTHER PUBLICATIONS

Cezac, N., et al., "A New Generation of Power Unipolar Devices: the Concept of the FLoating Islands MOS Transistor (FLIMOST)," *12 International Symposium on Power Semiconductor Devices and ICS (ISPSD 2000)*, Toulouse, France, May 22–25, 2000, pp. 69–72.

* cited by examiner

Primary Examiner—Nathan J. Flynn
Assistant Examiner—Fazli Erdem
(74) Attorney, Agent, or Firm—Robert L. King (57) ABSTRACT

A lateral semiconductor device (20) such as LDMOS, a LIGBT, a lateral diode, a lateral GTO, a lateral JFET or a lateral BJT, comprising a drift region (12) having a first surface (22) and a first conductivity type, first and second conductive (4, 8) extending into the drift region from the first surface. The lateral semiconductor device further comprises an additional region (24) or several additional regions, having a second conductivity type, between the first and second semiconductor regions (4, 8), the additional region extending into the drift region from the first surface (22), wherein the additional region forms a junction dividing the electric field between the first and second semiconductor regions when a current path is established between the first and second semiconductor regions. This allows the doping concentration of the drift region to be increased, thereby lowering the on-resistance of the device.

13 Claims, 7 Drawing Sheets

LATERAL SEMICONDUCTOR DEVICE WITH LOW ON-RESISTANCE AND METHOD OF MAKING THE SAME

FIELD OF THE INVENTION

This invention relates to power integrated circuits and in particular to a lateral semiconductor device and a method for forming a lateral semiconductor device.

BACKGROUND OF THE INVENTION

Some low to medium power Integrated Circuit devices (ICs), i.e. ICs operating at low to medium output power ranging between 2 Watts DC and 10 Watts DC peak, are known to incorporate a combination of CMOS, bipolar, and vertical drain MOS (VDMOS) and/or lateral drain MOS (LDMOS) power transistor devices on the same substrate.

The power LDMOS device is becoming the preferred structure due to the excellent characteristics of the LDMOS for low voltage applications (e.g. less than 1000 Volts), such as those required in the automotive electronics industry. For example, such power MOSFETs exhibit improved thermal stability, switching speed, and input impedance. The drain-to-source on-resistance (Rdson) is in the range of less than 1 m$\Omega$-cm$^2$. In addition, the voltage capability of the LDMOS can be layout adjustable (source-drain minimum space rule), and also as a result of the availability of advanced lithography techniques, the size of the LDMOS device can be reduced without changing the structure of the device.

However, in a lateral LDMOS transistor device, the voltage capability of the device is determined primarily by the resistivity of the epitaxial layer, which is a function of the doping concentration in the epitaxial layer, and the lateral length of the drift region, which is the region between the coplanar source and drain regions. The lateral length of the drift region cannot be less than a minimum value and the doping concentration cannot be above a maximum value in order to sustain the maximum operating voltage (Max BVdss) of the device. Thus, even with the usage of more advanced lithography techniques, for example in 0.8 $\mu$m and 0.6 $\mu$m design rule specifications, the lateral length of the drift region cannot go below the minimum value. In LDMOS the reduction of Rdson is limited due to the requirement of high breakdown voltage BVdss of these devices, which relatively thick and low doped epitaxial drift region governed by the "silicon limit" property expressed in the equation Rdson,sp=8.3×10$^{-9}$(BVdss)$^{2.5}$(m$\Omega$-cm$^2$).

Attempts have been made to reduce the Rdson in MOSFETs, however, it is desirable for the drain-to-source on resistance Rdson to be as small as possible so that the drain-to-source voltage and hence the power dissipation is low as possible. Additionally, the surface area of the LDMOS device accounts typically for 30% to 70% of the total area of the combination IC. Thus, with a LDMOS transistor device having a minimum lateral length for the drift region, the area of the LDMOS device can limit the overall die size reduction and hence is a major limiting factor for the overall industry to further reduce costs and improve the performance of such combination ICs.

Thus, there is therefore a need for an improved lateral semiconductor device which allows for further Rdson reduction enhancing BVdss without die size expansion.

SUMMARY OF THE INVENTION

In accordance with a first aspect of the present invention there is provided a lateral semiconductor device as recited in claim 1 of the accompanying claims.

In accordance with a second aspect of the present invention there is provided a method for forming a lateral semiconductor device as recited in claim 10 of the accompanying claims.

BRIEF DESCRIPTION OF THE DRAWINGS

Preferred embodiments of the present invention will now be described with reference to the accompanying drawings in which.

DETAILED DESCRIPTION

Figure 1:
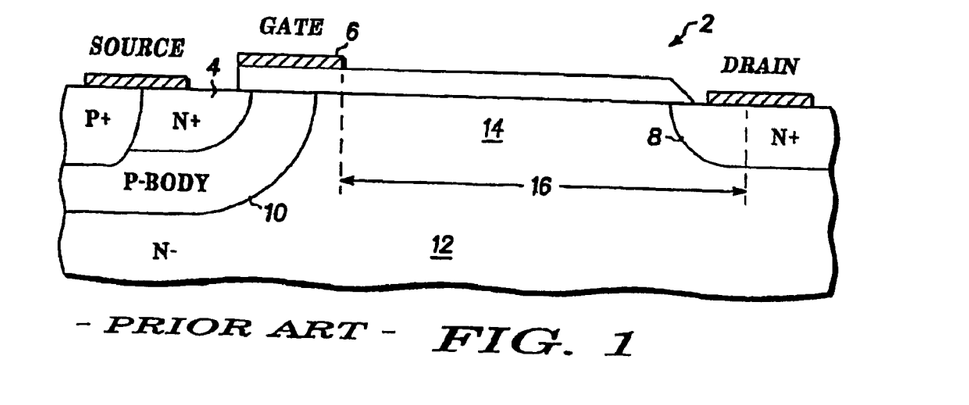
FIG. 1 is a schematic cross-sectional diagram of a LDMOS transistor device.

FIG. 1 is a schematic cross-sectional representation of a lateral power (LDMOS) transistor device 2 having a source region 4, a drain region 8 formed in an epitaxial layer 12 and a gate 6. The channel region of the LDMOS transistor device 2 is formed at the surface of a body region 10. The region 14 between the gate 6 and the drain region 8 is known as the drift region 14. The drift region 14 has a length 16.

As discussed in the introduction, the breakdown voltage (BVdss) of the LDMOS transistor device 2 is a function of the resistivity of the epitaxial layer 12, the length 16 of the drift region 14, and the thickness of the epitaxial layer 12. The doping concentration of the epitaxial layer 12 must be equal to or below a critical concentration, and the length 16 of the drift region 14 must be equal to or greater than a minimum length (Ld) in order to sustain operating voltages up to the breakdown voltage BVdss of the device.

Since the doping concentration of the epitaxial layer 12 is limited by a critical concentration (e.g. 4.10e15 cm$^{-3}$), the maximum BVdss and minimum Rdson is limited for these type of semiconductor devices. Additionally, since the length 16 of the drift region 14 cannot be less than the minimum length Ld, this length Ld limits the size to which the LDMOS transistor device can be reduced.

Figure 2:
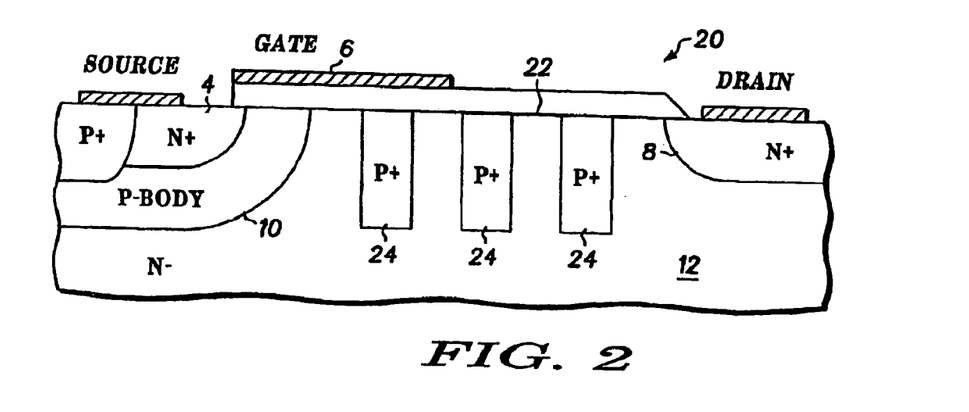
FIG. 2 is a schematic cross-sectional diagram of a LDMOS transistor device in accordance with an embodiment of the present invention.

Referring now to FIG. 2, a lateral semiconductor device 20 in accordance with an embodiment of the present invention comprises an epitaxial semiconductor region 12 having a first surface 22, conductive regions 4, 8 extending into the semiconductor region 12 from the first surface 24 and an additional region 24 extending into the semiconductor region 22 from the first surface 24, wherein the additional region 24 forms a junction dividing the electric field between the first and second conductive regions 4, 8 when an electric path 32 passes between the first and second conductive regions 4, 8.

In the embodiment shown In FIG. 2, three additional regions 24 are shown, however, there may be any number of additional regions, for example 4 or 9. Additionally, the additional regions are shown equidistant, however, the additional layers may be unevenly spaced. FIG. 2 shows a LDMOS transistor device, however, this may be applied in Insulated Gate Bipolar Transistors (IGBTs), GTO, JFETs, bipolar transistors, and lateral diodes, which require long drift regions or electrical paths between two conductive regions, and the like.

Figure 7A:
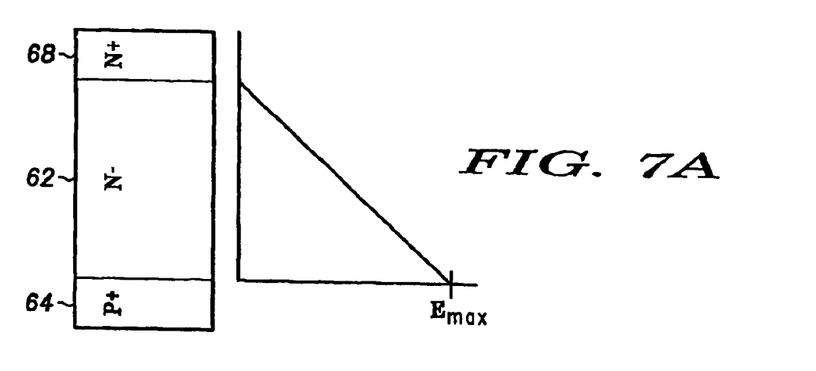
FIGS. 7A and 7B depict schematic diagrams and graphs of a conventional and non-conventional devices, respectively, to show the reduction of the maximum electrical field achieved at the junctions used in embodiments of the invention.
Figure 7B:
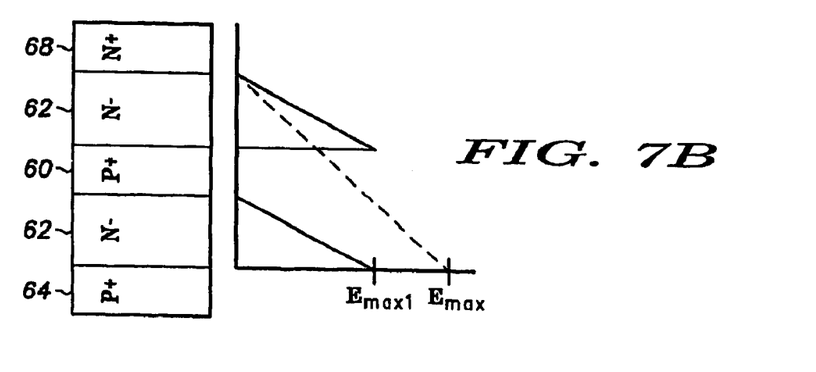

An electrical path flows through a drift region 12 of the LDMOS transistor device 20. The drift region is N-doped region and extends between the drain region 8 and the gate 6. Additional regions 24 are P-doped regions and extend from the surface 24 into the epitaxial layer of the semiconductor region 12. The additional regions 24 form junctions where the electric field is decreased when an electric path passes between the conductive regions, e.g. source region 4 and drain region 8. Thus, the electric field across the entire drift region between the source region 4 and the drain region 8 is divided by each junction formed by each P-doped additional region 24. FIGS. 7A and 7B depict schematic diagrams and graphs of a conventional and non-conventional devices, respectively, to show the reduction of the maximum electrical field achieved at the junctions used in embodiments of the invention. In comparison with conventional devices, devices with the configuration of the non-conventional device of FIG. 7B, the total maximum electric field between the source region 64 and drain region 68 is greatly reduced. FIG. 7A shows a schematic cross-section of a conventional PIN diode, and resulting electric field distribution and maximum electric field (Emax) across the depletion layer. FIG. 7B shows a schematic cross-section of a non-conventional PIN diode with a P-region 60 placed into the N-region 62 of the PIN diode, and resulting electric field distribution and maximum electric field (Emax1). In comparison, the additional P-doped region of the non-conventional device of FIG. 7B divides the electric field distribution such that the maximum electric field is lower than in the conventional device of FIG. 7A, such that Emax1<Emax. Although FIG. 7B shows that a single region 60 reduces the maximum electric field, further reduction in the maximum electric field can be achieved by using additional regions. Several additional regions in conjunction with each other reduce the electric field and can assume an intermediate potential to that of either side of the (PN) junction. In this embodiment, the each additional region in the plurality of additional regions is spaced apart in the semiconductor region to form alternate layers of semiconductor (N) region and additional (P) regions. Additionally, in this embodiment, the additional regions are arranged such that the electric field distribution on either side of each junction is substantially equal, when an electric path passes between the first and second conductive regions, however, the electric field distribution on either side of the pn junction does not necessarily need to be equal.

To reach the voltage handling capability of the conventional device, it is necessary to increase the N-region doping in the drift region. The on-resistance Rdson of a LDMOS transistor device depends on the channel resistance Rch and on the drift resistance Rd across the drift region between the gate region and the drain region. The drift resistance Rd across is about ⅔ of the on-resistance Rdson and the channel resistance is about ⅓ of the on resistance Rdson. By using additional regions between the source and drain, N-doping of the drift region can be increased, thus decreasing the Rdson without reaching the critical electric field.

Figure 8:
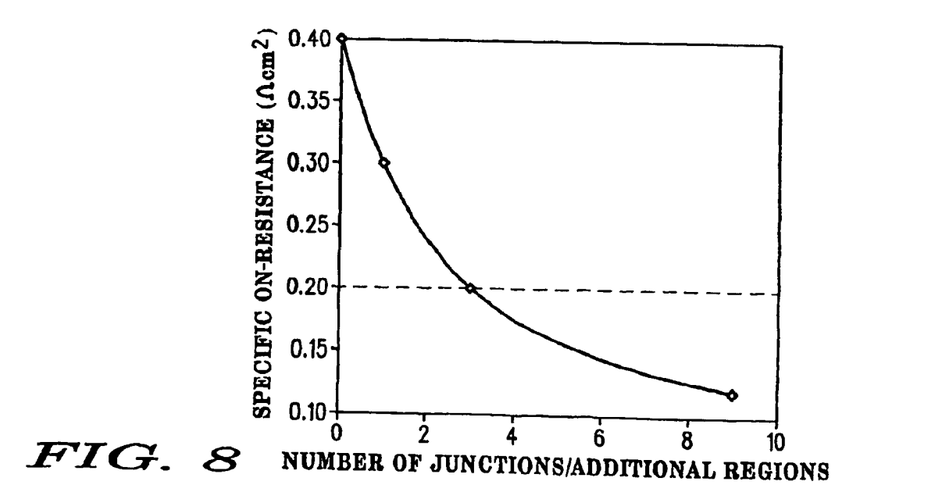
FIG. 8 is a graph showing the correlation between Rdson and the number of junctions in embodiments of the invention.

FIG. 8 is a graph showing the correlation between Rdson and the number of junctions in embodiments of the invention (e.g. 900 V device). Also, shown by a dotted line in the graph of FIG. 8 is the "silicon limit" of conventional standard unipolar devices represented by the equation Rdsson,sp=$8.3 \times 10^{-9}(BVdss)^{2.5}$ ($\Omega*cm^2$). For lateral MOS transistor devices with four additional regions integrated in the drift region, the surface overdoping increase ($10^{16}$ cm−3), with an improvement in Rdson of about 20% compared with a conventional LDMOS. More generally, for MOS transistor devices with a number of additional regions, the silicon limit is adjusted by the relationship Rdsson,sp=$16.6 \times 10^{-9}(BVdss)^{2.5}(n+1)^{-1.5}$ ($\Omega cm^2$), where n=the number of additional regions.

Thus, as discussed with reference to FIGS. 7A, 7B, and 8, additional regions, i.e. alternating N and P doped regions in the drift region of an LDMOS, reduce the maximum electric field, which allows for increasing the (N) doping of the drift region to reduce the Rdson without increasing the drift length and while maintaining a high breakdown voltage, BVdss. For example, for a known LDMOS transistor device, such as that shown in FIG. 1, having a breakdown voltage BVdss of 45 volts, and an epitaxial layer having a doping concentration of 4.10e15 $cm^{-3}$, the on-resistance is about 1.6 m$\Omega cm^2$ and a drift region has a minimum lateral length of 2.2 micrometers. The overall pitch of a cell of such a known LDMOS transistor device is 8.75 micrometers. For a LDMOS transistor device in accordance with an embodiment of this Invention, the doping concentration of the epitaxial layer in the drift region can be in the order of 2.10e16 $cm^{-3}$, the on resistance Rdson can have a magnitude of less than about 0.8 m$\Omega cm^2$.

Figure 3:
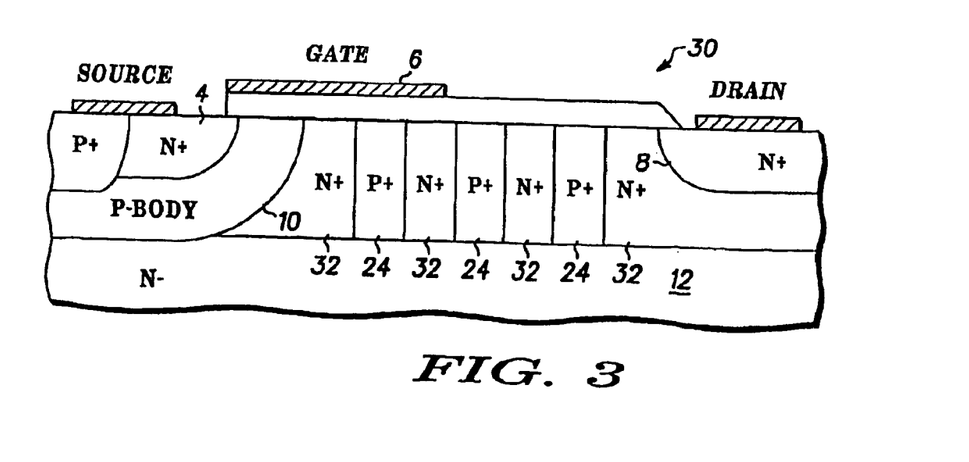
FIG. 3 is a schematic cross-sectional diagram of a LDMOS transistor device in accordance with another embodiment of the present invention.
Figure 4:
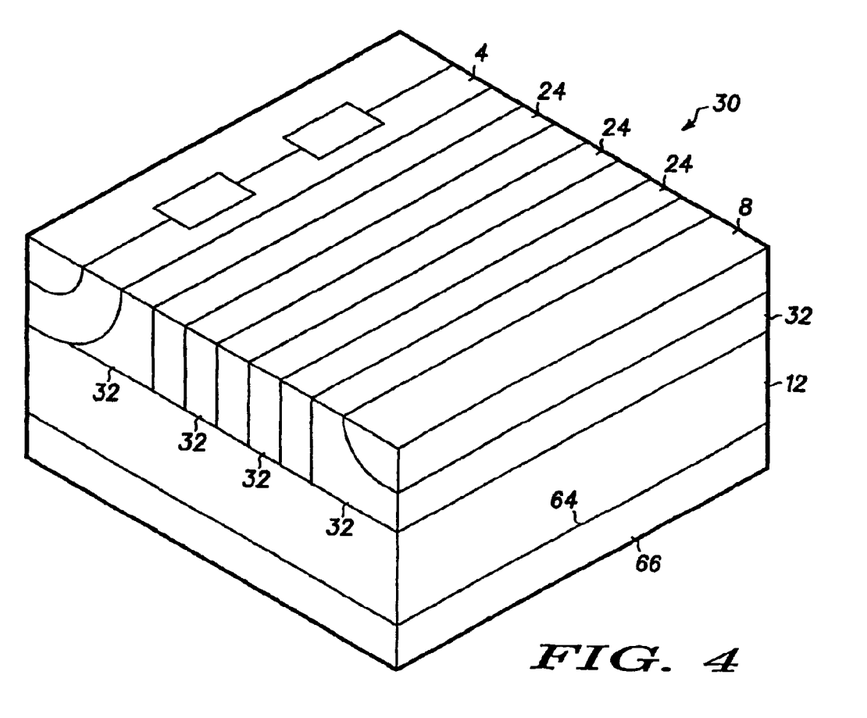
FIGS. 4 is schematic perspective diagram of the embodiment shown in FIG. 3.

Referring to FIG. 3, a schematic cross-sectional diagram of a LDMOS transistor device 30 in accordance with a second embodiment of the present invention is shown. In this embodiment, the semiconductor region 12 further comprises an area 12 having a first (N) dopant concentration (e.g. 4.10e15 $cm^{-3}$) and a second area 32 having a second (N) dopant concentration (2.10e16 $cm^{-3}$). The second area 32 extends from the first surface 22 between the first conductive (source) region 4 and the additional region 32, between each additional (P) region 24, and between an additional region 24 and the second conductive (drain) region 8. In this embodiment, the second N-doped area is at a higher dopant concentration to reduce the series resistance between the drain and source regions 4, 8. FIG. 4 is a schematic perspective diagram of the second embodiment shown in FIG. 3. In FIG. 4, it is shown that the alternate layers or areas 12 and 32 may be adjacent to each other and are vertical, i.e. both areas or layers 12 and 32 may extend from the surface 22. Additionally, the areas or layers may be substantially parallel to each other, and run substantially parallel to the source regions 4 and the drain regions 8, as shown and made clear by the perspective views of FIG. 4 and 5. In other words, in any embodiment discussed in this description, areas, layers, or zones 12,32 or 54 of the lateral semiconductor device may at least have the configuration as shown in the figures. For example, the plane or planes defined by each Junction formed by the alternate layers, areas or zones may be parallel with each other, extend vertically or perpendicular to the surface; and/or run parallel with the region and source planes extending vertically and perpendicular to the surface, where the region and source planes may be formed by the edges of the drain and source regions formed at the surface and run parallel to each other.

Figure 5:
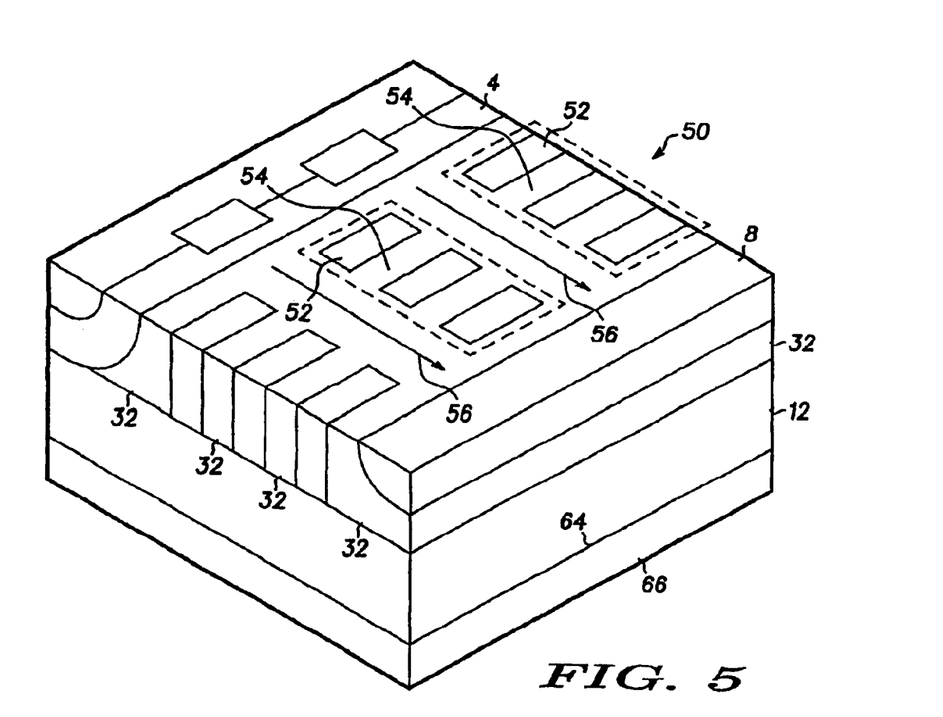
FIGS. 5 is schematic perspective diagrams of another embodiment, respectively.

FIG. 5 is a schematic perspective diagram of a third embodiment of the invention. In this embodiment, the device 50 has a plurality of zones 54. Each zone has alternate layers 52 of additional (P) regions with semiconductor epitaxial (N) region. The zones 54 are each spaced apart from each other zone such that when an electric path, indicated by arrows 56, passes between the source and drain regions 4, 8, the electric current path passes between the zones.

Figure 6:
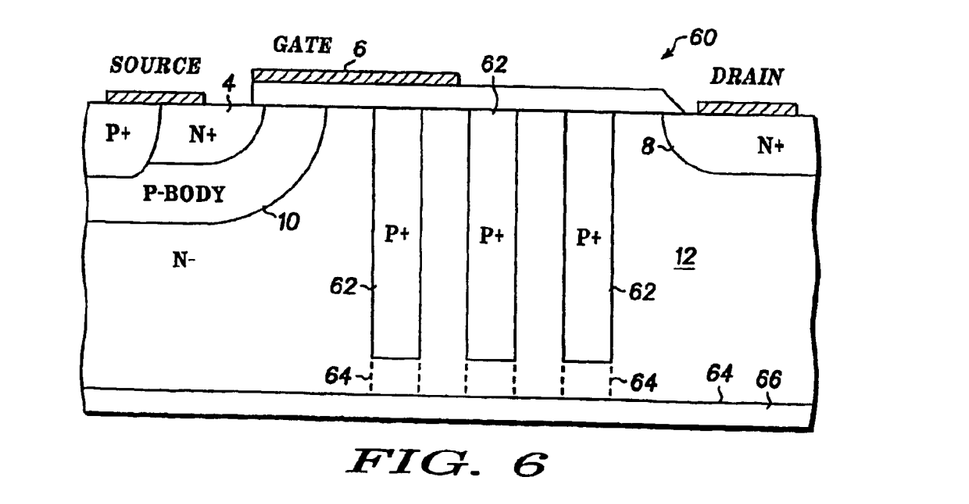
FIG. 6 is a schematic cross-sectional diagram of a LDMOS transistor device in accordance with another embodiment of the present invention.

Referring to FIG. 6, a schematic cross-sectional diagram of a LDMOS transistor device 60 in accordance with a third embodiment of the present Invention Is shown. In this embodiment, the semiconductor epitaxial region 12 has a second surface 64 that borders the substrate 66. Each additional region extends from the first surface into the semiconductor epitaxial region 12 through to nearly the second surface. In another embodiment, the additional regions 62 extend through to the second surface 64 to the substrate 66, shown by dashed lines 64. It is important in the embodiments of the invention that the current conduction between source and drain without degrading breakdown voltage is maintained.

A method of forming the lateral semiconductor device 20 in accordance with an embodiment of the present invention will now be described with reference to FIGS. 2 and 9–16. In this description, reference is made to layers and regions being formed of specific materials and materials having-certain conductivity types, but this is for illustrative purposes only. It is not intended that the present invention be limited to the specific materials referred to herein.

Figure 9:
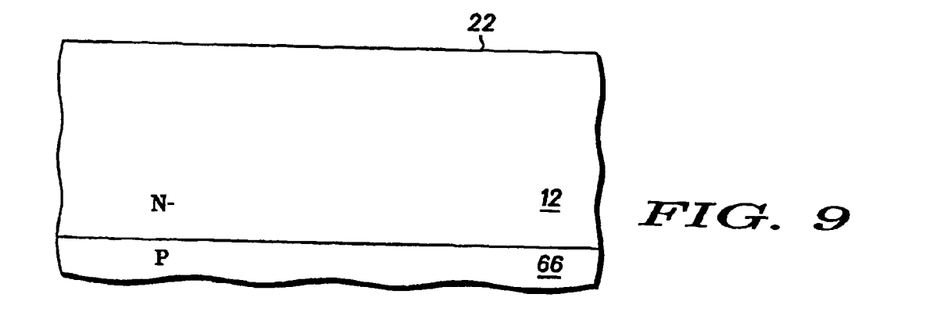
FIGS. 9–16 are schematic cross-sectional diagrams of the LDMOS transistor device of FIG. 2 during different stages of fabrication.
Figure 10:
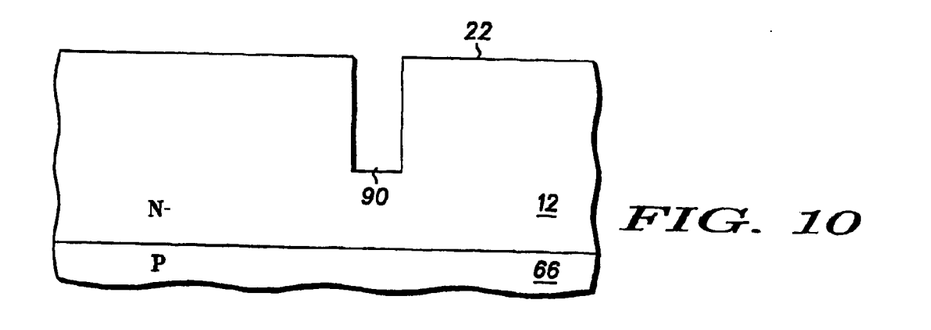

An epitaxial layer 12 of N—conductivity type is grown on a substrate 66 of P++ conductivity type, as shown in FIG. 9. In FIG. 5, a trench 90 is formed in the epitaxial layer 12, by for example dry etching using reactive ion etching (RIE), such that the trench extends into the epitaxial layer 22 to the desired depth from a first surface 22.

Figure 11:
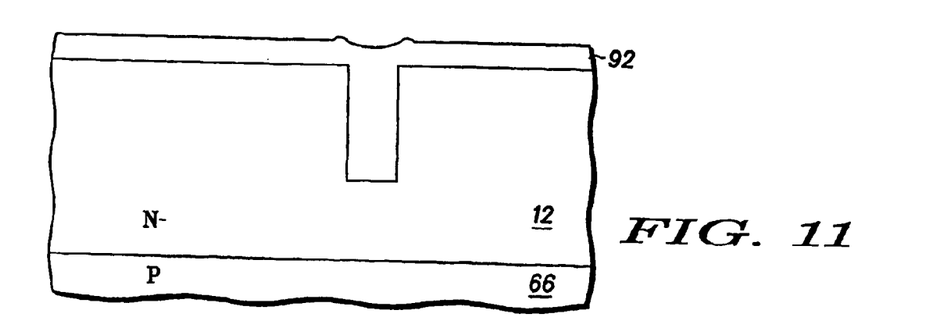
Figure 12:
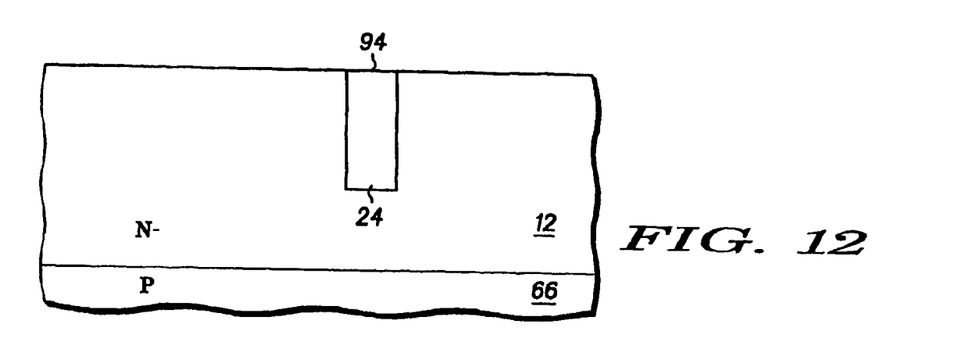

A dielectric layer 92, such as a silicon oxide layer, is then formed over the wafer by plasma enhanced chemical vapour deposition (PECVD), as shown in FIG. 11. The dielectric layer 92 is then planarized and standard gate oxide (not shown) is grown on the planarized dielectric layer 92. The excess oxide and dielectric layer 92 are then removed by wet etching to provide a additional region 24 filled with silicon (p+ regions) 94, as shown in FIG. 12, which can be made with trench or with classical diffusions.

Figure 13:
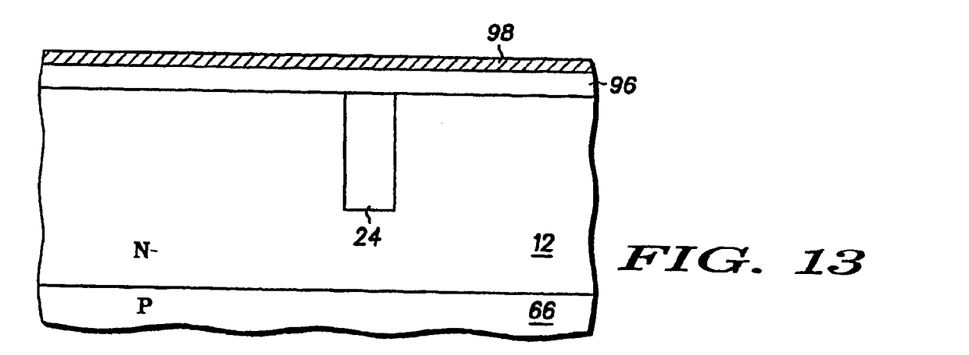
Figure 14:
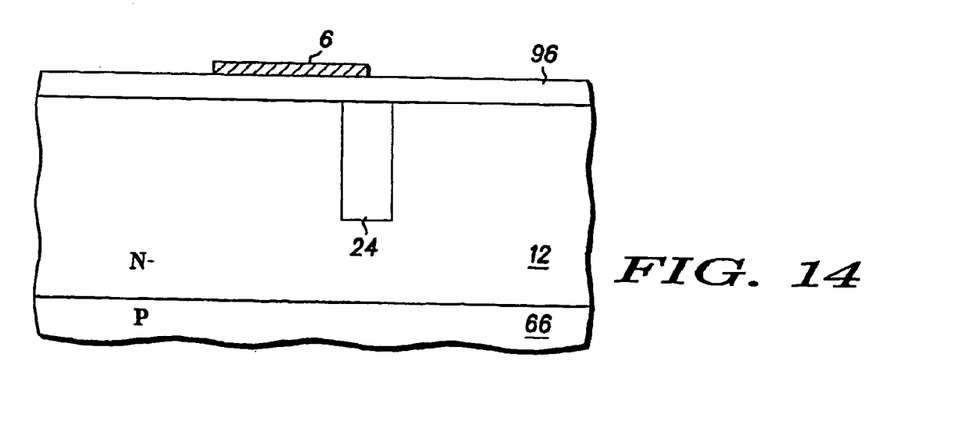

Field oxide, sacrificial oxide and gate oxide layers (shown as one layer 96) are then grown thermally on the first surface 22 of the epitaxial layer 12. A polysilicon layer 98 (or other type of conductive layer) is then formed over the oxide layer 46, for example by deposition, as shown in FIG. 13. As shown in FIG. 14, the polysilicon layer 98 is then patterned and etched to form the gate region 6 of the LDMOS transistor device 20.

Figure 15:
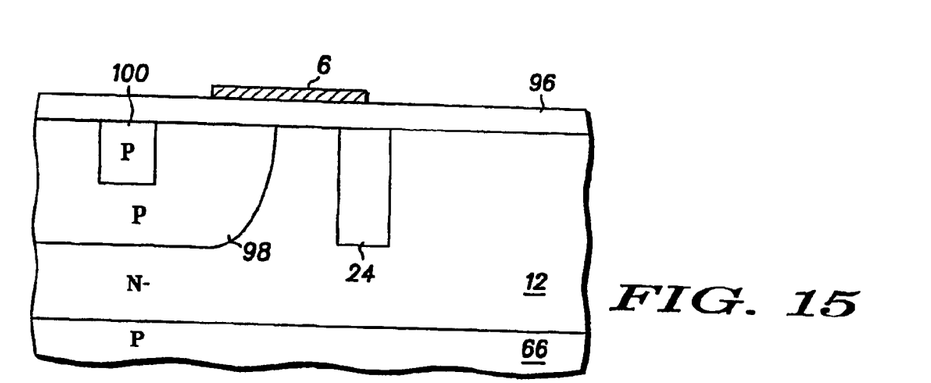

A mask (not shown) is formed over the gate region 6 and the oxide layer 96 and then a region 98 of P conductivity type material, such as boron (B11+), is formed, by implantation or diffusion, in the epitaxial layer 12, shown in FIG. 15. The region 98 is also known as the body region 98. The body region 98 provides the channel of the LDMOS transistor device 20. After forming the body region 98, a region 100 of P conductivity type material, such as boron, is formed, by for example Implantation or diffusion, in the body region 50 using a mask (not shown), as is well known in the art.

Figure 16:
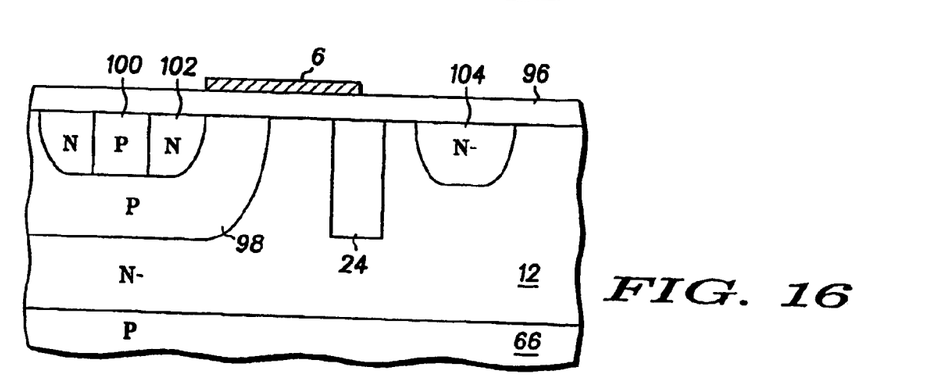

A mask is used to form by implantation or diffusion and the like, regions of N conductivity type material, such as arsenic or phosphorus dopant, in the body region 98 and the epitaxdal layer 12. The region 102 in the body region 100 forms the source region 4 and the region 104 in the epitaxial layer 12 forms the drain region 8, as shown in FIG. 16. Metal (not shown) is then deposited to form contacts to the source region 4 and region 100 (the source is couple to the body region), drain region 8 and gate region 6.

It will be appreciated that a LDMOS transistor device typically comprises a plurality of transistor cell designs, such as cells, fingers, strips or waves, each having the structure shown in FIG. 16. Of course, as discussed above, any number of additional regions 24 may be formed by forming the required number of trenches 90 as shown and discussed with reference to FIG. 10. For example in FIG. 2 there are three additional regions 24. Additionally, the trenches may be formed to any depth as required, as discussed above with reference to FIG. 6. Likewise, any pattern, such as the perforated pattern discussed above with reference to FIG. 5, may be used to form the additional region layouts. Of course, other shaped trenches and fillings for the additional regions may be used and still achieve the same object which is to reduce the overall maximum electric field distribution between the drain and the source regions 4, 8.

While specific embodiments have been shown and described, further modifications and improvements will occur to those skilled in the art. We desire it to be understood, therefore, that this invention is not limited to the particular forms shown and we intend in the appended claims to cover all modifications that do not depart from the scope of this invention.

What is claimed is:

1. A lateral semiconductor device comprising:

a semiconductor region having a first surface and a first conductivity;

first and second conductive regions extending into the semiconductor region from the first surface;

a first additional region, having a second conductivity, between the first and second conductive regions, the first additional region extending into the semiconductor region from the first surface, wherein the first additional region forms a junction dividing an electric field between the first and second conductive regions when an electric path passes between the first and second conductive regions, the semiconductor region further comprising a first area having a first dopant concentration and a second area having a second dopant concentration, said second area extending from said first surface between said first conductive region and said first additional region, and said first additional region and said second conductive region, wherein the second area reduces series resistance between the first and second conductive regions when an electric path passes between the first and second conductive regions; and a plurality of additional regions, wherein each of the plurality of additional regions extends into the semiconductor region from the first surface and forms a junction dividing the electric field between the first and second conductive regions when an electric path passes between the first and second conductive regions.

2. The lateral semiconductor device according to claim 1 wherein the semiconductor region further comprises a second surface and the first additional region extends from the first surface through to the second surface.

3. The lateral semiconductor device according to claim 1 wherein each additional region in the plurality of additional regions is spaced apart from other additional regions in the semiconductor region to form alternate layers of semiconductor region and additional regions.

4. A lateral semiconductor device comprising:
a semiconductor region having a first surface and a first conductivity;
first and second conductive regions extending into the semiconductor region from the first surface;
a first additional region, having a second conductivity, between the first and second conductive regions, the first additional region extending into the semiconductor region from the first surface, wherein the first additional region forms a junction dividing an electric field between the first and second conductive regions when an electric path passes between the first and second conductive regions;
a plurality of additional regions, wherein each of the plurality of additional regions extends into the semiconductor region from the first surface and forms a junction dividing the electric field between the first and second conductive regions when an electric path passes between the first and second conductive regions; and
a plurality of alternate layer zones having alternate layers of semiconductor region and additional regions, wherein each zone is spaced apart from each other zone such that when an electric path passes between the first and second conductive regions, the electric path passes between the zones.

5. A lateral semiconductor device comprising:
a semiconductor region having a first surface and a first conductivity;
first and second conductive regions extending into the semiconductor region from the first surface;
a first additional region, having a second conductivity, between the first and second conductive regions, the first additional region extending into the semiconductor region from the first surface, wherein the first additional region forms a junction dividing an electric field between the first and second conductive regions when an electric path passes between the first and second conductive regions; and
a plurality of additional regions, wherein each of the plurality of additional regions extends into the semiconductor region from the first surface and forms a junction dividing the electric field between the first and second conductive regions when an electric path passes between the first and second conductive regions wherein within the plurality of additional regions the electric field distribution on either side of each junction thereof is substantially equal when an electric path passes between the first and second conductive regions.

6. The lateral semiconductor device according to claim 1 wherein the first additional region is a dielectric material.

7. The lateral semiconductor device according to claim 1 wherein the lateral semiconductor device is one of the following:
an IGBT device;
a lateral diode; and
a LDMOS transistor device.

8. A method of forming a lateral semiconductor device comprising the steps of:
providing a semiconductor region having a first surface and a first conductivity;
forming first and second conductive regions in the semiconductor region, the first and second conductive regions extending from the first surface;
forming a first additional region, having a second conductivity, between the first and second conductive regions, the first additional region extending into the semiconductor region from the first surface, wherein the first additional region forms a junction dividing the electric field between the first and second conductive regions when an electric path passes between the first and second conductive regions;
forming a plurality of additional regions, wherein each of the plurality of additional regions extends into the semiconductor region from the first surface and forms a junction dividing an electric field between the first and second conductive regions when an electric path passes between the first and second conductive regions; and
forming a first area having a first dopant concentration and a second area having a second dopant concentration, said second area extending from said first surface between said first conductive region and said first additional region, and said first additional region and said second conductive region, wherein the second area reduces series resistance between the first and second conductive regions when an electric path passes between the first and second conductive regions.

9. The method of forming a lateral semiconductor device according to claim 8 wherein the semiconductor region further comprises a second surface and the first additional region extends from the first surface through to the second surface.

10. The method of forming a lateral semiconductor device according to claim 8 wherein the plurality of additional regions are spaced apart in the semiconductor region to form alternate layers of semiconductor region and additional regions.

11. The method of forming a lateral semiconductor device according to claim 10 further comprising the stop of forming a plurality of alternate layer zones having alternate layers of semiconductor region and additional regions, wherein each zone is spaced apart from each other zone such that when an electric path passes between the first and second conductive regions, the electric path passes between the zones.

12. A method of forming a lateral semiconductor device comprising:
providing a semiconductor region having a first surface and a first conductivity;
forming first and second conductive regions in the semiconductor region, the first and second conductive regions extending from the first surface;
forming a first additional region, having a second conductivity, between the first and second conductive regions, the first additional region extending into the semiconductor region from the first surface, wherein the first additional region forms a junction dividing the electric field between the first and second conductive regions when an electric path passes between the first and second conductive regions; and
forming a plurality of additional regions, wherein each of the plurality additional regions extends into the semiconductor region from the first surface and forms a junction dividing an electric field between the first and second conductive regions to create a substantially equal electric field distribution on either side of the junction when an electric path passes between the first and second conductive regions.

13. The method of forming a lateral semiconductor device according to claim 8 wherein the plurality of additional regions are of dielectric material.

* * * * *

UNITED STATES PATENT AND TRADEMARK OFFICE
CERTIFICATE OF CORRECTION

PATENT NO. : 6,906,381 B1  Page 1 of 1
APPLICATION NO. : 10/297693
DATED : June 14, 2005
INVENTOR(S) : Andre Peyre-Lavigne It is certified that error appears in the above-identified patent and that said Letters Patent is hereby corrected as shown below:

In Column 8, Line 43, Claim 11:

Change "stop" to --step--

In Column 8, Line 66, Claim 12:

Add --of-- after "the plurality"

Signed and Sealed this

Second Day of January, 2007

JON W. DUDAS
*Director of the United States Patent and Trademark Office*